VOLTAGE CONTROLLED MONOLITHIC AUTOMATIC GAIN CONTROL ATTENUATOR DEVICE
Filed June 29, 1967
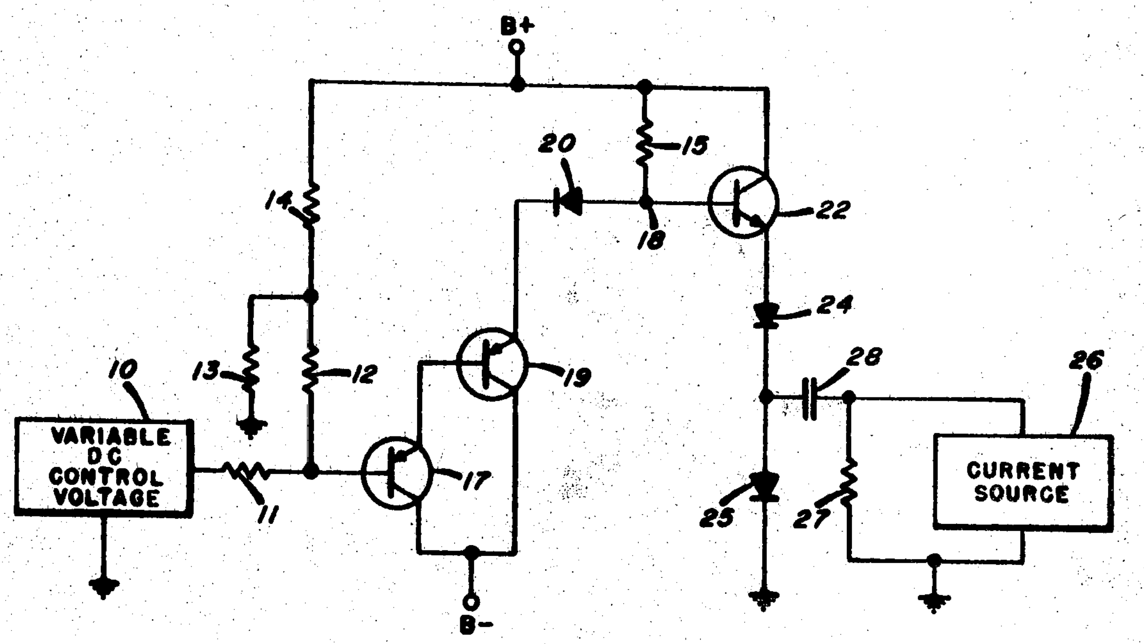
INVENTORS
FREDERICK C. ZIELINSKI
WILLIAM JONES, JR.
BY Marshall A. Lerner
Arthur L. Bowers
ATTORNEYS United States Patent Office
3,560,995
Patented Feb. 2, 1971

3,560,995

VOLTAGE CONTROLLED MONOLITHIC AUTOMATIC GAIN CONTROL ATTENUATOR DEVICE

Frederick C. Zielinski, Glen Burnie, and William Jones, Jr., Baltimore, Md., assignors, by mesne assignments, to the United States of America as represented by the Secretary of the Navy Filed June 29, 1967, Ser. No. 650,138
Int. Cl. G06g 7/12
U.S. Cl. 307—229 2 Claims

ABSTRACT OF THE DISCLOSURE

A DC voltage controlled temperature compensated diode attenuator having two diodes connected in series and operated in a range in which the dynamic impedance of the diodes varies exponentially with respect to the DC control voltage applied across them. A voltage application transistor connected in series with the diodes and three semiconductor components serially arranged and connected across the diode attenuator circuit by way of the voltage application transistor to cause the effective impedance in the attenuator circuit to remain constant regardless of change in temperature by varying the DC voltage applied to the voltage application transistor in response to temperature changes affecting the attenuator.

BACKGROUND OF THE INVENTION

Field of invention

The present invention relates to a logarithmic attenuator and, more particularly, to a voltage controlled attenuator having a temperature compensating circuit.

Description of the prior art

In the field of logarithmic attenuators it has been the general practice to employ diodes which are controlled by a current source. A typical such prior art device is disclosed in U.S. Pat. No. 3,254,304 to Barrett. The Barrett patent discloses a logarithmic attenuator using semiconductor diodes. Barrett accomplishes temperature compensation by making the resistance of the control voltage sufficiently high so as to render the controlling element essentially a constant current source. However, it would be impossible under such circumstances to obtain a logarithmic response from the device described in the Barrett patent.

SUMMARY OF THE INVENTION

The general purpose of the present invention is to provide a temperature compensated logarithmic attenuator which embraces all the advantages of similarly employed prior art devices and possesses none of the aforedescribed disadvantages. To attain this, the present invention provides a varying D.C. control voltage to be applied across the attenuator circuit. The applied voltage is maintained in the range in which a dynamic impedance of the diodes varies exponentially with respect to the voltage. The control applied voltage is also applied to a temperature compensating circuit which is connected in parallel with the attenuator circuit. The temperature compensating circuit has a number of semiconductor devices equal to the semiconductors in the attenuator circuit. When the dynamic impedance in the diodes and the base to emitter voltage of the voltage application transistor is altered due to a temperature change, the voltage in the temperature compensating circuit is correspondingly altered to cause the effective impedance across the diodes to remain constant and immune to temperature change.

Accordingly, an object of the present invention is to provide means to attenuate a voltage logarithmically.

Another object of the present invention is to provide means to compensate for temperature variation in a semiconductor circuit.

A further object of the present invention is to provide temperature compensating means to compensate for a change in dynamic impedance of a logarithmic attenuator.

Still a further object of the present invention is to provide a variable control voltage to control a logarithmic attenuator and a temperature compensating circuit associated therewith.

Other objects and many of the attendant advantages of the present invention will readily become apparent as the same becomes better understood by reference to the following detailed description when considered in connection with the accompanying drawings in which like reference numerals designate like parts throughout the figures thereof.

BRIEF DESCRIPTION OF THE DRAWINGS

The figure is a schematic diagram of an embodiment of the present invention.

DESCRIPTION OF THE PREFERRED EMBODIMENT

Referring now to the figure there is shown a variable D.C. control voltage source 10 coupled to a current limiting resistor 11. The opposite terminal of resistor 11 is coupled to a voltage divider network containing resistors 12, 13 and 14. Resistor 11 is also coupled to the base terminal of transistor 17. The emitter transistor 17 is coupled to the base of transistor 19. The emitter of transistor 19 is coupled to the cathode of diode 20. The anode of diode 20 is coupled to resistor 15, as well as the base terminal of transistor 22 at terminal 18. The emitter of transistor 22 is coupled to the anode of diode 24. The cathode of diode 24 is coupled to the anode of diode 25, the cathode which is grounded.

A utilization device may be coupled to the junction of attenuator diodes 24 and 25. In the embodiment disclosed the utilization device is a current source 26 in parallel with resistor 27. However, the utilization device may be any device the output of which is to be attenuated. The current source resistor combination is coupled through filter capacitor 28 across diode 25.

A B+ power supply is coupled through resistor 15 and terminal 18 to semiconductor devices 17, 19, 20, 22, 24 and 25. The collector terminals of transistors 17 and 19 are coupled to a B− power supply.

In the normal operation of the device, transistor 22 and diodes 24 and 25 comprise essentially the attenuator circuit and transistors 17 and 19 and diode 20 comprise essentially the temperature compensating circuit. The varying D.C. control voltage source 10 is operable to control the voltage applied to the attenuator circuit by controlling the voltage at point 18, or, in effect, the voltage at the base of transistor 22. Voltage from source 10 is applied to point 18 only after passing through the temperature compensating circuit comprised of transistors 17 and 19 and diode 20. The range of D.C. control voltage 10 is maintained so as to cause the operating voltages across diodes 24 and 25 to remain in the region in which the dynamic impedance of the diode varies exponentially with respect to the voltage across the diodes. In other words, the dynamic impedance of diodes 24 and 25 increases with an increase in voltage across them and decreases with a decrease in voltage across them. This variation in the dynamic impedance of each diode will be logarithmic in nature within a certain voltage range which depends on the specific diodes used. This variation of dynamic impedance responsive to the applied DC voltage produces the attenuation desired in the utilization device.

It can thus be seen from the figure, that when there is no temperature change and the D.C. voltage source 10 increases linearly, the voltage at point 18 increases linearly thereby increasing the current through transistor 22 and the voltages across diodes 24 and 25. As the voltages across diodes 24 and 25 increase linearly, the dynamic impedance, or the gain, increases exponentially within a predetermined operating region. Voltage from source 10 is applied to point 18 of the circuit by way of the temperature compensation circuit which is composed of transistors 17 and 19 and diode 20. These three semiconductor devices are biased so as to permit substantially the same voltage applied to the base of transistor 17 to be applied to the base of transistor 22.

The temperature compensation circuit, composed of transistors 17 and 19 and diode 20, are coupled across the attenuator circuit, composed of voltage application transistor 22 and diodes 24 and 25. The semiconductor elements in the temperature compensation circuit equal the semiconductor elements in the attenuator circuit. The temperature compensation circuit functions to compensate the attenuator circuit for effective impedance variations caused by temperature variations because the three elements of the compensation circuit have the same temperature coefficient as the three elements of the attenuator circuit. Because the temperature coefficients of the two circuits are matched and they have the same voltage source any affect on the attenuator circuit created by a temperature change will also be created in the compensation circuit.

As is well known in the art, a semiconductor device has a negative temperature coefficient which means that as the temperature of the semiconductor device increases its internal impedance decreases. Bearing this in mind, it can be seen from the drawing that as the temperature increases the impedance of the junctions of diodes 24 and 25 decreases, as well as the impedance of the base-emitter junction of transistor 22. This decrease in internal impedance of the attenuator circuit creates a drop in the effective impedance presented to the utilization device if the voltage output of transistor 22 remains constant. The temperature compensation circuit which has an identical temperature coefficient as the attenuator circuit is likewise affected by the temperature rise, however. This change in the temperature compensation circuit causes a corresponding decrease in voltage being applied to point 18, the base of transistor 22. Such a decrease in voltage at point 18 will cause a corresponding decrease in voltage drop across diodes 24 and 25 in an amount which will cause the effective resistance of the diodes to remain constant. The temperature changes involved do not affect the voltages presented to the base of transistor 17.

The inherent operation of the invention upon a decrease in ambient temperature is a mirror image of the above described operation.

In the illustrated embodiment, the attenuator circuit is coupled through filter capacitor 28 to a current source 26 arranged in parallel with a resistor 27, however, the attenuator circuit can be coupled to any utilization device.

Thus, it is seen that the present invention provides an attenuator having a gain which is the logarithmic function of a control voltage source. It is further seen that the device provides a temperature compensating circuit for retaining the attenuator circuit free of any variation in response to change in temperature of the components.

Obviously, many modifications and variations of the present invention are possible in the light of the above teachings.

What is claimed is:

1. A gain control device comprising
- an attenuator circuit containing a plurality of semiconductor devices, the gain of which vary exponentially with respect to the voltage applied thereto;
- a temperature compensating network coupled across said attenuator circuit having a number of semiconductor devices equal to that contained in said attenuator circuit;
- a control voltage source coupled to said network for controlling the voltage applied to said attenuator circuit; and
- a utilization device coupled to said attenuator circuit;
- whereby the effective impedance of said attenuator circuit is kept independent of variation of temperature of said plurality of semiconductor devices in said attenuator circuit by said temperature compensating network.

2. The device as described in claim 1 wherein said plurality of semiconductor devices in said attenuator circuit comprise a transistor coupled in series with a first diode which is coupled in series with a second diode, said utilization device comprising a current source in parallel with a resistor.

References Cited

UNITED STATES PATENTS

| | | | |
|---|---|---|---|
| 2,932,714 | 4/1960 | Merrill | 323—68X |
| 2,963,656 | 12/1960 | Parris | 307—297X |
| 3,050,644 | 8/1962 | Ironside | 307—310X |
| 3,329,836 | 7/1967 | Pearlman et al. | 307—229 |
| 3,374,361 | 3/1968 | Callis | 307—310X |

OTHER REFERENCES

Department of the Army Technical Manual (TM11-690), Basic Theory and Application of Transistors, March 1959, pp. 85, 86, 90, and 92. A copy of these papers is located in class 307, subclass 310 in Group 254.

STANLEY T. KRAWCZEWICZ, Primary Examiner

U.S. Cl. X.R.

307—310; 323—68; 330—23